United States Patent [19]
Inoue et al.

[11] Patent Number: 5,278,789
[45] Date of Patent: Jan. 11, 1994

[54] SEMICONDUCTOR MEMORY DEVICE WITH IMPROVED BUFFER FOR GENERATING INTERNAL WRITE DESIGNATING SIGNAL AND OPERATING METHOD THEREOF

[75] Inventors: Kazunari Inoue; Katsumi Dosaka, both of Hyogo, Japan

[73] Assignee: Mitsubishi Denki Kabushiki Kaisha, Tokyo, Japan

[21] Appl. No.: 801,807

[22] Filed: Dec. 6, 1991

[30] Foreign Application Priority Data

Dec. 12, 1990 [JP] Japan .................. 2-401583

[51] Int. Cl.$^5$ ............................................... G11C 8/02
[52] U.S. Cl. ..................... 365/189.01; 365/189.05; 365/195
[58] Field of Search ................. 365/189.01, 189.05, 365/195

[56] References Cited

U.S. PATENT DOCUMENTS

| | | | |
|---|---|---|---|
| 4,992,983 | 2/1991 | Suzuki | 365/189.05 |
| 5,043,944 | 8/1991 | Nakamura et al. | 365/189.05 |
| 5,155,702 | 10/1992 | Mia | 365/189.05 |

FOREIGN PATENT DOCUMENTS 61-68796 4/1986 Japan .

OTHER PUBLICATIONS

Osamu MINATO et al., "2K×8 Bit Hi-CMOS Static RAM's", *IEEE Journal of Solid-State Circuits*, vol. SC-15, No. 4, Aug. 1980, pp. 656-600.

*Primary Examiner*—Joseph A. Popek
*Assistant Examiner*—Christopher R. Glembocki
*Attorney, Agent, or Firm*—Lowe, Price, LeBlanc & Becker

[57] ABSTRACT

A write enable buffer circuit for generating an internal write designating signal includes a gate circuit for inhibiting generation of the signal in response to an internal output designating signal which attains a settled state prior to a data outputting operation by a data outputting buffer. In data reading, the gate circuit forbids generation of an internal write designating signal to certainly hold the internal write designating signal in a disable state even if a noise is generated in data output. Thus, it is prevented that an internal write designating signal is erroneously generated due to noise in data output to bring data output buffer into an output high impedance state, and also the data input buffer is certainly maintained at an inactive state in data output.

11 Claims, 11 Drawing Sheets (a) ext /RAS
(b) ext /CAS
(c) ext /WE
(d) ψWE'
(e) ψWE
(f) /ψW
(g) OUTPUT OF GATE CIRCUIT 71
(h) OUTPUT OF DELAY CIRCUIT 175

SEMICONDUCTOR MEMORY DEVICE WITH IMPROVED BUFFER FOR GENERATING INTERNAL WRITE DESIGNATING SIGNAL AND OPERATING METHOD THEREOF

BACKGROUND OF THE INVENTION

1. Field of the Invention

The present invention relates to semiconductor memory devices, and particularly to a random access memory capable of reading and writing of data in a random sequence. More particularly, the present invention relates to an improvement of a buffer circuit for generating an internal write designating signal from an externally applied write designating signal.

2. Description of the Background Art

Semiconductor memory devices include a random access memory capable of writing and reading data in a random sequence. The random access memory is used in various fields as a main storage memory or an image processing memory in a computer. The random access memories are divided, in terms of a requirement of refresh operation of stored data into, static random access memories requiring no refresh operation and dynamic random access memories requiring refresh operation. Although the present invention is applicable to both of the static random access memories and the dynamic random access memories, application in a dynamic random access memory will be described below.

FIG. 1 is a diagram illustrating one example of construction of the entirety of a dynamic random access memory 100. In FIG. 1, dynamic random access memory 100 includes a memory cell array in which dynamic type memory cells MC are arranged in a matrix of rows and columns, an address buffer 5 receiving external address A0—An applied to an address input terminal 15 for generating an internal address, a row decoder 2 responsive to an internal row address from the address buffer 5 for selecting a row of memory cell array 1, and a column decoder 4 responsive to an internal column address from address buffer 5 for selecting a column of memory cell array 1.

The dynamic random access memory 100 further includes sense amplifiers for detecting and amplifying data of memory cells at a row in memory cell array 1 selected-by row decoder 2, and I/O gates connecting a column selected by column decoder 4 to internal data bus 50. In FIG. 1, the sense amplifiers and the I/O gates are expressed as a single block 3.

Dynamic random access memory 100 further includes buffer circuits 6, 7 and 8 for generating various kinds of internal control signals, an output buffer 9a for generating external read data IOi from internal read data on a common data bus 50 and providing it to a data input/output terminal 19, and an input buffer 9b for generating internal write data from the data IOi provided to data input/output terminal 19 and transferring internal data onto common data bus 50.

Buffer circuit 6 generates internal control signals for respectively activating address buffer 5 and the sense amplifier included in block 3 in response to a row address strobe signal/RAS which is a first operation timing defining signal applied to a clock input terminal 16a and a column address strobe signal/CAS which is a second operation timing defining signal applied to a clock input terminal 16b. Buffer circuit 6 is referred to as an internal clock generating buffer circuit hereinafter.

Buffer circuit 7 generates an internal write designating signal ψWE in response to a write enable signal/WE which is an external write designating signal applied to an external clock input terminal 17 and an internal control signal/ψW from internal clock generating buffer circuit 6 and supplies the generated signal to input buffer 9b. The buffer circuit 7 is referred to as a write enable buffer circuit hereinafter.

Buffer circuit 8 generates an internal read designating signal ψOE in response to an output enable signal/OE which is an external output designating signal applied to external clock input terminal 18 and an internal control signal/ψO from buffer circuit 6 for internal clock generation and applies the generated signal to output buffer 9a. The internal read designating signal ψOE and the internal write designating signal ψWE set output buffer 9a and input buffer 9b to an active state, respectively.

In FIG. 1, data input/output terminal 19 is shown inputting/outputting data in a unit of 1 bit. It may be constituted so that data of a plurality of bits are inputted and outputted in parallel from the data input/output terminal 19. The data input/output terminal 19 is assumed to input/output data on a bit by bit basis in the description below. Next, operation of the dynamic random access memory shown in FIG. 1 will be described.

A row address strobe signal/RAS which is a first operation timing defining signal applied to external clock input terminal 16a falls to "L" of an active state, and then dynamic random access memory 100 enters from a precharge state (or a standby state) into a memory operation cycle. Buffer circuit 6 for internal clock generation generates an internal control signal for activating address buffer 5 in response to a row address strobe signal/RAS externally applied. At that time, internal clock generating buffer circuit 6 also generates an internal control signal for activating row decoder 2, though not clearly shown in FIG. 1.

Address buffer 5 captures address A0—An applied to input terminal 15 as a row address in response to an internal control signal from the internal clock generating buffer circuit 6 to generate an internal row address and applied it to and row decoder 2. Row decoder 2 decodes the internal row address to select a corresponding single row in memory cell array 1. Subsequently, a sense amplifier included in block 3 is activated in response to an internal control signal from buffer circuit 6 for internal clock generation, and the data in memory cells on the single row selected by the row decoder 2 are detected and amplified.

Subsequently, a column address strobe signal/CAS which is a second operation timing defining signal applied to external clock input terminal 16b falls to "L" of an active state. Buffer circuit 6 for internal clock generation generates an internal control signal for capturing a column address in response to the column address strobe signal/CAS in the active state. Buffer circuit 6 for internal clock generation then also generates an internal control signal for activating column decoder 4. Address buffer 5, in response to the new internal control signal from buffer circuit 6 for internal clock generation, captures the address A0—An applied to address input terminal 15 as a column address to generate an internal column address and applies it to column decoder 4. Column decoder 4 generates a signal for selecting a single column in memory cell array 1 in response to the internal column address One of I/O gates included in block 3 attains a conductive state in response to the column selection signal from column decoder 4, and the column specified by column decoder 4 in memory cell array 1 is connected to common data bus 50. With the above-described series of processes, the operation of selecting a memory cell in memory cell array 1 is finished.

In reading data, output buffer 9a is activated in response to an internal read designating signal ψOE, and external read data is generated from data of a selection memory cell transmitted to common data bus 50, which is transmitted to data input/output terminal 19. The presence/absence of the data outputting operation is set by read designating signal /OE externally applied to external clock input terminal 18. Output enable buffer circuit 8 generates an internal read designating signal ψOE in response to an internal control signal/ψO from internal clock generating buffer circuit 6 and a read designating signal /OE externally applied to external clock input terminal 18. The internal control signal/ψO is generated from internal clock generating buffer circuit 6 when both of row address strobe signal /RAS and a column address strobe signal /CAS applied to external clock input terminals 16a and 16b attain an active state.

In writing data, input buffer 9b is activated in response to an internal write designating signal ψWE from write enable buffer circuit 7, and internal write data is generated from data applied to data input/output terminal 19 which is transferred onto common data bus 50. The data on common data bus 50 is transferred onto a column in memory cell array 1 specified by column decoder 4 through I/O gate of block 3. Data is thus written in a memory cell selected by row decoder 2 and column decoder 4.

Internal wire designating signal ψWE is generated in response to an external write designating signal /WE applied to external clock input terminal 17 and an internal control signal/ψW from buffer circuit 6 for internal clock generation. The internal control signal/ψW is generated when both of strobe signals /RAS and /CAS applied to external clock input terminals 16a and 16b attain an active state at "L". The timing at which the internal write designating signal ψWE makes transition to the active state is determined according to a later one of timings of transition to activation of column address strobe signal /CAS applied to external clock input terminal 16b and write designating signal /WE applied to external clock input terminal 17. An operation mode in which a signal /WE attains an active state prior to a signal /CAS is referred to as an early write cycle.

As described above, in a structure in which data is inputted and outputted through common terminal 19, by using external write designating signal /WE and read designating signal /OE, collision of data read from the dynamic random access memory 100 and to be written data applied to input/output terminal 19 can be prevented. Also, in order to prevent the collision of written data and read data more reliably, write enable buffer circuit 7 applies an internal write designating signal ψWE to output enable buffer circuit 8 and to set the output enable buffer circuit 8 to an output disable state (an inactive state) in writing data. Next, construction and operation of the write enable buffer circuit 7 and the output enable buffer circuit 8 will be described referring to FIG. 2.

FIG. 2 is a block diagram schematically showing constructions of buffer circuit 7 for write enable and buffer circuit 8 for output enable. In FIG. 2, write enable buffer circuit 7 includes a gate circuit 71 receiving a write designating signal /WE applied to external clock input terminal 17 and an internal control signal/ψW from buffer circuit 6 for internal clock generation and generating a first internal write designating signal ψWE', and a ψWE generating circuit 72 generating a second internal write designating signal ψWE which attains an active state for a predetermined period in response to an active state of the first internal write designating signal ψWE'.

Output enable buffer circuit 8 includes a gate circuit 81 responsive to an output designating signal /OE applied to an external clock input terminal 18 and an internal control signal/ψO generated from buffer circuit 6 for internal clock generation to generate a first internal output designating signal ψOE', and a ψOE generating circuit 82 responsive to a first internal output designating signal ψOE' to generate a second internal output designating signal ψOE. The ψOE generating circuit 82 generates a pulse signal which attains an active state for a predetermined period in response to a rise of the first internal output designating signal ψOE'. Also, the ψOE generating circuit 82 is brought into an output disable state in response to the second internal write designating signal ψWE from ψWE generating circuit 72. The output disable state means a condition under which the second internal read designating signal ψOE is set to "L" which is an inactive state. Next, operation of the write enable buffer circuit 7 and output enable buffer circuit 8 will be described.

FIG. 3 is a signal waveform diagram indicating operation of the buffer circuits 7 and 8 in data reading. Referring to FIGS. 2 and 3, operation in data reading will be described below. Upon transition of an externally applied row address strobe signal/RAS to an active state "L", the memory cycle of a dynamic random access memory is started. In FIG. 3, a signal external to the dynamic random access memory is indicated with "ext" at the head of the signal. Selection of a row of memory cells in memory cell array 1 (refer to FIG. 1), and detection and amplification of data of the row of memory cells are performed in response to the external row address strobe signal ext/RAS, and then a column address strobe signal ext/CAS from the outside attains an active state.

Upon fall of the external column address strobe signal ext/CAS to "L", internal control signal/ψO falls to an active state at "L". Normally, data is read after completion of operation of selecting a memory cell in memory cell array 1, so that an internal control signal/ψO is normally not brought to an active state ("L" level) until both of the external signals /RAS and /CAS attains an active state at "L". When both of the internal control signal/ψO and an output designating signal /OE applied to external clock input terminal 18 attain "L", a first internal output designating signal ψOE' from gate circuit 81 rises to "H". In a data reading mode, a write designating signal /WE applied to external clock input terminal 17 is at an inactive "H" level. Accordingly, both of the first and second internal write designating signals ψWE' and ψWE are at "L".

ψOE generating circuit 82 is brought to an operational state in response to the second internal write designating signal ψWE at "L" and the first internal output designating signal ψOE' at "H". ψOE generating circuit 82 amplifies (or buffers) the first output designating signal ψOE' to output a second internal output designating signal ψOE. Output buffer 9a is activated in response to the second internal output designating signal ψOE, and produces external output data from data supplied onto common data bus 50 and applies the output data to data input/output terminal 19. Valid output data extIOi is outputted from data input/output terminal 19. When one memory cycle is completed and a column address strobe signal/CAS rises to "H", the internal control signal/ψO rises to "H" and both of the first and second internal output designating signals ψOE' and ψOE fall to an inactive state at "L". Output buffer 9a thus attains an inactive state, and sets its output at a high impedance state.

Next, operation of buffer circuits 7 and 8 in data writing will be described referring to FIG. 4 which is an operation waveform diagram thereof The memory cycle is started upon a fall of a row address strobe signal ext/RAS from the outside, The same operations as those in data reading are performed until a memory cell is selected in memory cell array 1. When the column address strobe signal ext/CAS from the outside falls to "L", an internal control signal/ψW for writing is generated from buffer circuit 6 for internal clock generation. Gate circuit 71 makes first internal write designating signal ψWE' rise to an active state "H" when both of a write designating signal ext/WE applied to external clock input terminal 17 and the internal control signal/ψW attain "L". In FIG. 4, a case is shown where the write designating signal ext/WE from the outside falls prior to the falls of the column address strobe signal ext/CAS from the outside. The timing of writing data is determined with a later fall of signals ext/CAS and ext/WE from the outside as described above. Generally, when a data input/output terminal is commonly used for data input and data output, the timing is set so that the write designating signal ext/WE from the outside falls prior to the falling of the column address strobe signal ext/CAS from the outside.

ψWE generating circuit 72 generates a write pulse lasting for a predetermined time period, that is, a second internal write designating signal ψWE in response to a rise of the first internal write designating signal ψWE'. Input buffer 9b is thus activated, captures data IOi applied to data input/output terminal 19 and produces internal write data onto common data bus 50.

Second internal write designating signal ψWE is also applied to a control input of ψOE generating circuit 82 to bring the ψOE generating circuit 82 into an output disable state to inhibit generation of second internal output designating signal ψOE. Output buffer 9a is thus set in an output high impedance state, so that write data at data input/output terminal 19 is not subjected to adverse effects from an output of output buffer 9a.

Internal write data on common data bus 50 is written in a selected memory cell through a selected column in memory cell array 1. Subsequently, signals/RAS and /CAS rise to "H" to complete the data write cycle.

Instead of a structure in which generation of an internal output designating signal is inhibited with an internal write designating signal as described above, a construction can be employed in which an internal write designating signal is applied to an output buffer and data output of the data output buffer is inhibited with the internal write designating signal.

FIG. 5 is a diagram showing another construction of a conventional data output buffer. In FIG. 5, data output buffer 90 includes gate circuits G1 and G2 at the first stage and output transistors OT1 and OT2 at the output stage. Gate circuit G1 receives internal read data φ, first internal read designating signal ψWE' and an output of an inverter IV6. Inverter IV6 inverts second internal output designating signal ψOE. The gate circuit G1 outputs a signal of "H" only when all of its inputs are at "L". Gate circuit G2 receives an output of the inverter IV3, an output of an inverter IV6 and first internal write designating signal ψWE'. Inverter IV3 inverts internal read data φ.The gate circuit G2 outputs a signal of "H" only when all of its inputs are at "L". Internal read data φ is data read out from a memory cell selected by row decoder 2 and column decoder 4 in memory cell array 1 and transferred onto common bus 50.

An output of gate circuit G1 is applied to a gate of output transistor OT1 through inverters IV1 and IV2. An output of gate circuit G2 is transferred to a gate of output transistor OT2 through inverters IV4 and IV5. Inverters IV1 and IV2 and inverters IV4 and IV5 constitute buffers, respectively.

Output transistor OT1 has its one conduction terminal connected to an operation power supply potential Vcc and the other conduction terminal connected to data input/output terminal 19. Output transistor OT2 has its one conduction terminal connected to data input/output terminal 19 and the other conduction terminal connected to the other power supply potential Vss which is ground potential, for example. Next, the operation will be described.

In data reading, first internal write designating signal ψWE' is at "L" and the second internal read designating signal ψOE is at "H". Accordingly, an output of inverter IV6 is at "L". Gate circuits G1 and G2 are thus brought into enable states, respectively, and gate circuits G1 and G2 operate as inverters. Now, if internal read data φ is "0", an output of gate circuit G1 is "1" ("H"), and an output of gate circuit G2 is "0" ("L"). Inverters IV1 and IV2 are mutually connected in a cascade manner, and an output of gate circuit G1 is buffered and transferred to the gate of output transistor OT1. An output of gate circuit G1 is now at "H", so that output transistor OT1 attains an ON state. On the other hand, an output of gate circuit G2 is at "L", and output transistor OT2 which receives an output of the gate circuit G2 at its gate through inverters IV4 and IV5 attains an OFF state. An "H" signal is thus transmitted from operational power supply potential Vcc through output transistor OT1 to data input/output terminal 19.

When internal read data φ is "1", output transistor OT1 attains an OFF state and output transistor OT2 attains an ON state. Data input/output terminal 19 is discharged to the other power supply potential Vss level through the output transistor OT2 and the signal potential of data input/output terminal 19 attains "L" accordingly.

The internal read data φ and the external read data IOi transmitted to data input/output terminal 19 have logics inverted with each other. This is because, in a dynamic random access memory, bit lines constitute complementary bit line pairs and common data bus 50 is also formed of complementary signal line pair, and output buffer 90 receives data on a signal line of negative logic (signal line on which a signal having its logic inverting from read data).

In data writing, first internal write designating signal ψWE' is at "H" and second internal designating signal ψOE is at "L". Both of gate circuits G1 and G2 are brought into output disable states and the output signal level thereof is set to "L" regardless of the logic of internal read data φ. Both of output transistors OT1 and OT2 attain an OFF state, and an output node of the data output buffer 90 is brought into a high impedance state. Thus, collision between data transmitted onto common data bus 50 and write data transmitted to data input-/output terminal 19 is prevented for enabling reliable data writing.

FIG. 6 is a diagram schematically showing structure of an output portion of data output buffer 9a (90) Although specific configuration of the entirety of data output buffer 9a in FIG. 1 is not clearly shown, the circuit construction of data output buffer 9a is obtained by omitting a signal path transmitting an internal write designating signal ψWE' in FIG. 5.

Dynamic random access memories are employed, e.g., as main storage devices in computers, in practice. Data input/output terminal 19 is connected to external equipment such as a computer through a signal interconnection 150. In the signal interconnection 150, parasitic capacitance 200 such as interconnection capacitance exists as a matter of course. Transmission of read data to data input/output terminal 19 by output buffer 9a (90) is equivalent to charge/discharge of parasitic capacitance 200 which is associated with the signal interconnection 150. When data of "H" is read from output buffer 9a (90), the parasitic capacitance 200 is charged from operational power supply potential Vcc through output transistor OT1. When output buffer 9a (90) outputs data of "L", the electric charges charged in the parasitic capacitance 200 are discharged to the other power supply potential Vss which is ground potential, for example, through output transistor OT2.

In order to read data in a dynamic random access memory at high speed, the charge/discharge of the parasitic capacitance 200 must be performed at high speed. The discharge of the electric charges of the parasitic capacitance 200 is performed to the other power supply potential Vss. The other power supply potential (hereinafter, simply referred to as ground potential) Vss is used commonly to all the circuits in the dynamic random access memory 100 as shown in FIG. 1. That is, the ground line is set to ground potential Vss from the outside through terminal 155. The ground line 160 has interconnection resistance. The charges of parasitic capacitance 200 are discharged onto ground line 160. Accordingly, with discharged charges from the parasitic capacitance 200, the potential of ground line 160 disadvantageously rises to be a noise in discharging of the parasitic capacitance 200, resulting in malfunctions such as data writing when data reading should be performed.

As to the potential rise of the ground line 160, the amount of charges/discharges at one time becomes larger as the number of input/output bits of devices increases from ×1 bit structure in which a dynamic random access memory performs data input/output for 1 bit unit, to ×4 bit structure performing data input-/output in 4 bits, ×8 bit structure, and ×16 bit structure. The extent of the rise of potential becomes more considerable, accordingly. The malfunctions due to noise (disadvantageous rise of potential in ground lines) in data output will be described in more detail below. In FIG. 7, buffer circuits such as internal clock generating buffer circuit 6, write enable buffer circuit 7, and data output buffer 9a share ground line 160. On the ground line 160, discharge current I from data output buffer 9a flows. External clock generating buffer circuit 6, as shown in FIG. 1, receives row address strobe signal/-RAS and column address strobe signal/CAS respectively applied to external clock input terminals 16a and 16b. As shown in FIG. 2, write enable buffer circuit 7 receives a write designating signal/WE from the outside applied to external clock input terminal 17. Normally, a dynamic random access memory has its signal input/output level set to TTL level for matching with external equipment (CPU, controller and so forth) configured with TTL (Transistor.Transistor.Logic) base. In the TTL level, "H" is approximately 2.5 V or higher, and "L" is approximately 0.5 V or lower.

As shown in FIG. 2, gate circuit 71 of write enable buffer circuit 7 receives a write designating signal/WE (ext/WE) externally applied and an internal control signal /ψW. The write designating signal/WE from outside is a signal of the TTL level as described above. An input logic threshold voltage of gate circuit 71 is set to the TTL level. The input logic threshold voltage includes the difference between operational power supply potential-Vcc and the other power supply potential Vss as a determination factor thereof. In normal operation, that is, when the other power supply potential Vss is b 0 V, as shown in FIG. 8, the input logic values of gate circuit 71 are set such that about 2.5 V or higher is determined "H" and about 0.5 V or lower is determined "L".

Now, as shown in FIG. 8, it is assumed that the other power supply potential Vss increases by ΔV1 to attain Vss1 with discharge of data output buffer 9a. In this case, an input logic threshold voltage of the gate circuit 71 shifts toward a potential accordingly, and a reference signal potential H' indicating the "H" level and a reference signal potential L' indicating the "L" level also shift toward the high potential accordingly. In this case, the signal potential L' increases to a level between "H" and "L" of the TTL level in normal operation. At that time, there is a possibility that data circuit 71 determines a signal /WE at "H" to be at "L" in data reading and instantly brings a first internal write designating signal ψWE' which is its output signal to the "H" level.

When the potential increase of the ground line 160 becomes ΔV2 and the potential Vss becomes Vss2 as shown in FIG. 8, if a signal potential determining "H" and "L" of the gate circuit 71 attains H" and L", the potential level of the signal potential L" is at a level higher than the TTL "H" level in normal operation. In this case, gate circuit 71 determines both of the input signals/WE and /ψW to be at "L", and makes the first internal write designating signal ψWE' rise to "H". Data output operation where noise (glitch) is caused in a first internal write designating signal ψWE' will be described below.

FIG. 9 is a signal waveform diagram showing a data reading operation where glitch is caused in the first internal write designating signal ψWE'. In FIG. 9, when a column address strobe signal /CAS (ext/CAS) falls to "L", an internal control signal ψO is produced. When both of the internal control signal /ψO and an output designate signal/OE (ext/OE) from outside attain "L", a first output designating signal ψOE' is produced from gate circuit 81. ψOE generating circuit 82 generates a second internal output designating signal ψOE in response to the first output designating signal ψOE'. Output buffer 9a is activated by the second internal output designating signal ψOE, and output data IOi (ext/IOi) is outputted to data input/output terminal 19. The parasitic capacitance 200 is discharged to increase the potential of ground line 160, as shown in FIG. 6, when "L" data is outputted by the operation of output buffer 9a. With the rise of potential of ground line 160, glitch A is produced in the first internal write designating signal ψWE' as described above.

ψWE generating circuit 72 generates a second internal write designating signal ψWE having a predetermined time width t1 in response to the rising edge of the first internal write designating signal ψWE'. Accordingly, even if the level of glitch A of the first write designating signal ψWE' is very low, ψWE generating circuit 72 generates a second internal write designating signal ψWE having a predetermined time width t1 in response to the glitch A.

When output enable buffer circuit 8 has the construction shown in FIG. 2, in response to the second internal write designating signal ψWE, ψOE generating circuit 82 is reset and the second internal output designating signal ψOE falls to "L" level. Thus, input buffer 9b operates. On the other hand, an output of output buffer 9a attains a high impedance state. In this case, the read data appearing at data input/output terminal 19 is not held in a sufficient time period (e.g., a data hold time set in specification), and is thus held for a short a time, so that a problem is produced that precise data reading cannot be performed.

Also, as shown in FIG. 2, without resetting of ψOE generating circuit 82 with construction of output buffer 90 as shown in FIG. 5, even if a second internal output designating signal ψOE is generated, gate circuits G1 and G2 stay in an output disable state for that period due to glitch A of the first internal write designating signal ψWE', with a result that an output of data output buffer 90 attains a high impedance state. Even if the period of glitch A of the first internal write designating signal ψWE' is very short, data output buffer 90 shown in FIG. 5 also stays in an output high impedance state for that period, so that data reading cannot be performed precisely.

Further, stored data may be decaded because data writing circuitry operates due to the glitch A to write unstable data at data input/output terminal 19 into a selected memory cell.

In order to prevent malfunctions due to the glitch A of a first internal write designating signal ψWE' as described above, construction of a write enable buffer circuit as shown in FIG. 10 may be employed. The write enable buffer circuit 170 shown in FIG. 10 is generally used in a static random access memory.

Same reference numerals are assigned to components of the write enable buffer circuit shown in FIG. 10 and corresponding components of the write enable buffer circuit shown in FIG. 2. In FIG. 10, write enable buffer circuit 170 includes a delay circuit 175 for delaying an output of gate circuit 71 for a predetermined time period, a gate circuit 73 for receiving an output of gate circuit 71 and an output of delay circuit 175, and an inverter 74 for receiving an output of gate circuit 73. A first internal write designating signal ψWE' is produced from inverter 74. Gate circuit 73 outputs a signal of "L" only when both of the inputs are at "H". Next, operations of the write enable buffer circuit 170 shown in FIG. 10 will be described referring to FIG. 11 which is a waveform diagram of the operation.

An external write designating signal/WE (ext/WE) applied to an external clock input terminal 17 is set at "L" when data is written. Subsequently, after completion of selecting operation of memory cells in a memory cell array, a column address strobe signal/CAS (ext/CAS) from outside falls to "L". In response to the fall to "L" of the column address strobe signal/CAS from outside, an internal control signal/ψW falls to "L". Thus, an output of gate circuit 71 rises to "H". An output of delay circuit 175 rises to "H" after a time T has passed since the rise of the output of gate circuit 71. Gate circuit 73 outputs a "L" signal when both of the inputs attain "H". Inverter circuit 74 inverts an output of gate circuit 73. Accordingly, a first internal write designating signal ψWE' rises to "H" after a time t2 passes after the signal /CAS falls to "L". In FIG. 11, time T is equal to time t2 or shorter. In FIG. 11, the time t2 is shown considerably longer than time T, but this is because the delay time in gate circuit 73 and inverter circuit 74 is shown exaggerated.

In the circuit construction shown in FIG. 10, in data reading, an external write designating signal/WE applied to clock input terminal 17 is at "H" and an output of gate circuit 71 is "L". Now, an operation where glitch is caused due to the data reading operation in an output of gate circuit 71 will be described referring to FIG. 12 which is a waveform diagram of the operation.

In FIG. 12, a case is considered where glitch A is generated in an output of gate circuit 71 at time Ta. The glitch A is delayed by time T by delay circuit 175. Accordingly, the glitch A' of the output of delay circuit 175 appears at time Tb. An output of gate circuit 73 attains "L" only when both of an output of gate circuit 71 and an output of delay circuit 175 are at "H". Accordingly, even if glitch A is generated in an output of gate circuit 71, the level of an output of gate circuit 73 is "H", and the first internal write designating signal ψWE' stays at "L".

Provision of delay circuit 175 as described above can prevent malfunctions due to glitch. However, in the case of the circuit construction shown in FIG. 10, a first internal write designating signal ψWE' is generated after a time t2 has passed since a column address strobe signal/CAS (ext/CAS) from the outside attained "L" in data writing operation. A second internal write designating signal ψWE is generated for a predetermined time width in response to the first internal write designating signal ψWE'. Accordingly, there is a problem that data writing takes a long time. Especially, in a high speed dynamic random access memory, as one cycle time is short, the period of "L" of the write designating signal/WE from outside is also short. In this case, setting of timing is extremely difficult for generating a second internal write designating signal ψWE having a sufficient pulse width. If the write pulse width is made short, precise data writing cannot be performed.

A structure for preventing bad influences upon reading operation by noise of write data in data reading is shown in Japanese Patent Laying-Open No. 61-68796. The prior art device includes a write control circuit which prevents transmission of an output of a data writing buffer circuit into a storage element in data reading operation. A write control signal applied to the write control circuit brings the write control circuit in an operational state only in data reading, and brings it in a non-operational state in data writing. However, in the prior art reference, no structure is shown for preventing a data output buffer from falling into an output high impedance state due to an internal write designating signal in data reading. Also, the prior art reference gives no consideration to glitch caused in a writing control signal due to the data reading operation.

SUMMARY OF THE INVENTION

It is an object of the present invention to provide a semiconductor memory device with high reliability which eliminates disadvantages of a conventional semiconductor memory device as described above.

It is another object of the present invention to provide a semiconductor memory device capable of reading data at high speed with high accuracy.

It is still another object of the present invention to provide a semiconductor memory device including a write enable buffer circuit capable of certainly maintaining an internal write designating signal in an inactive state without sacrifice of writing speed.

It is yet another object of the present invention to provide a method capable of reading data surely.

A semiconductor memory device according to the present invention includes internal output designating signal generating circuitry for generating an internal output designating signal in response to externally applied output designating signal, output circuitry activated in response to the internal output designating signal for outputting data read from a selected memory cell outside the device, internal write designating signal generating circuitry for generating an internal write designating signal in response to the write designating signal from outside, and an input circuitry which is activated in response to the internal write designating signal for generating internal write data from write data externally applied for writing into a selected memory cell in a memory cell array.

The internal write designating signal generating circuitry includes a circuit for inhibiting generation of the internal write designating signal in response to an internal output designating signal.

In data reading, an internal read signal is generated. In the internal write designating signal generating circuitry, the generation of the internal write designating signal is inhibited in response to the generated internal read designating signal. Thus, even if noise is produced due to data output in data reading, an internal write designating signal is certainly maintained at an inactive state to surely prevent malfunctions of a data input/output buffer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
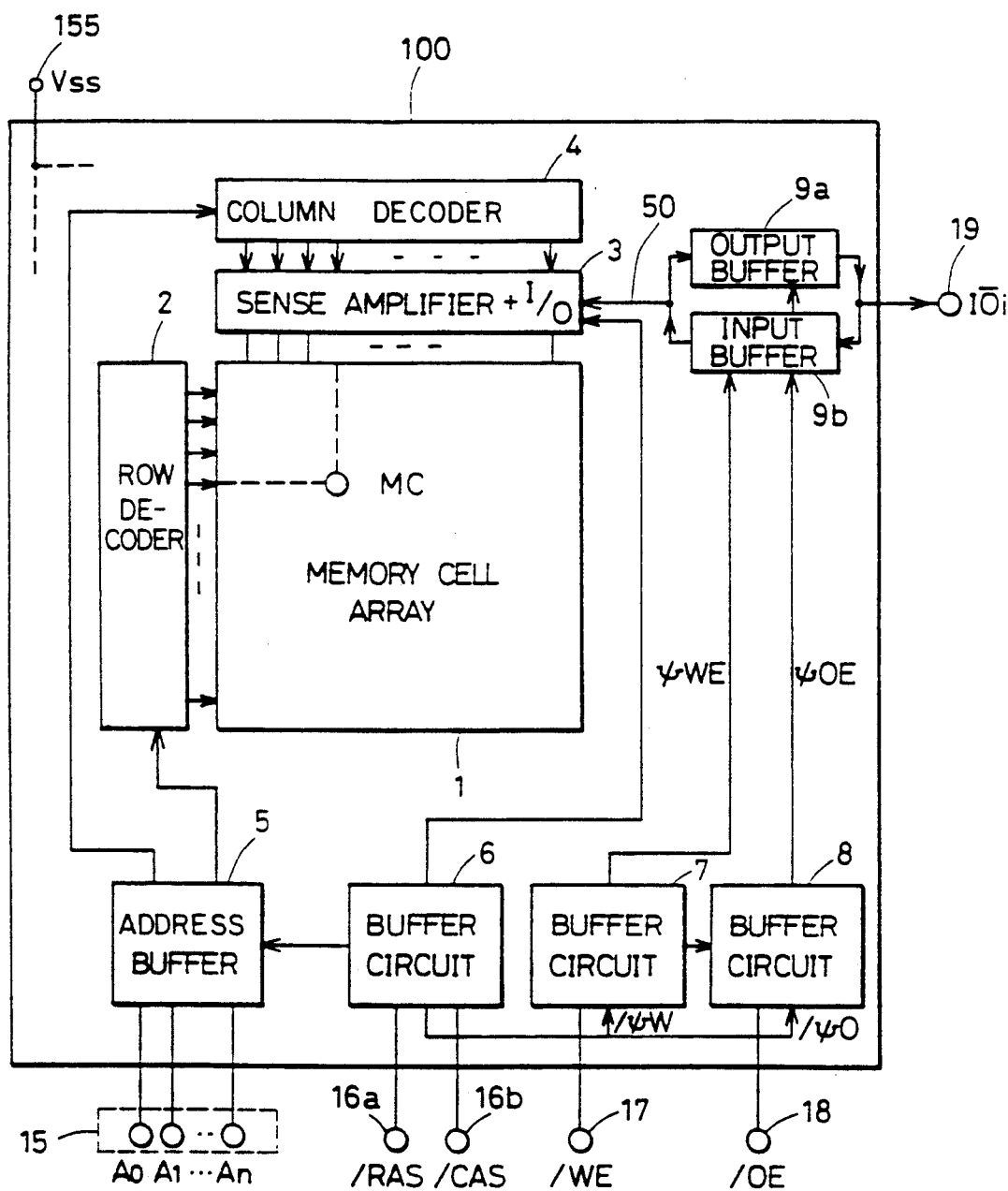
FIG. 1 is a diagram showing a construction of the entirety of a conventional semiconductor memory device.
Figure 2:
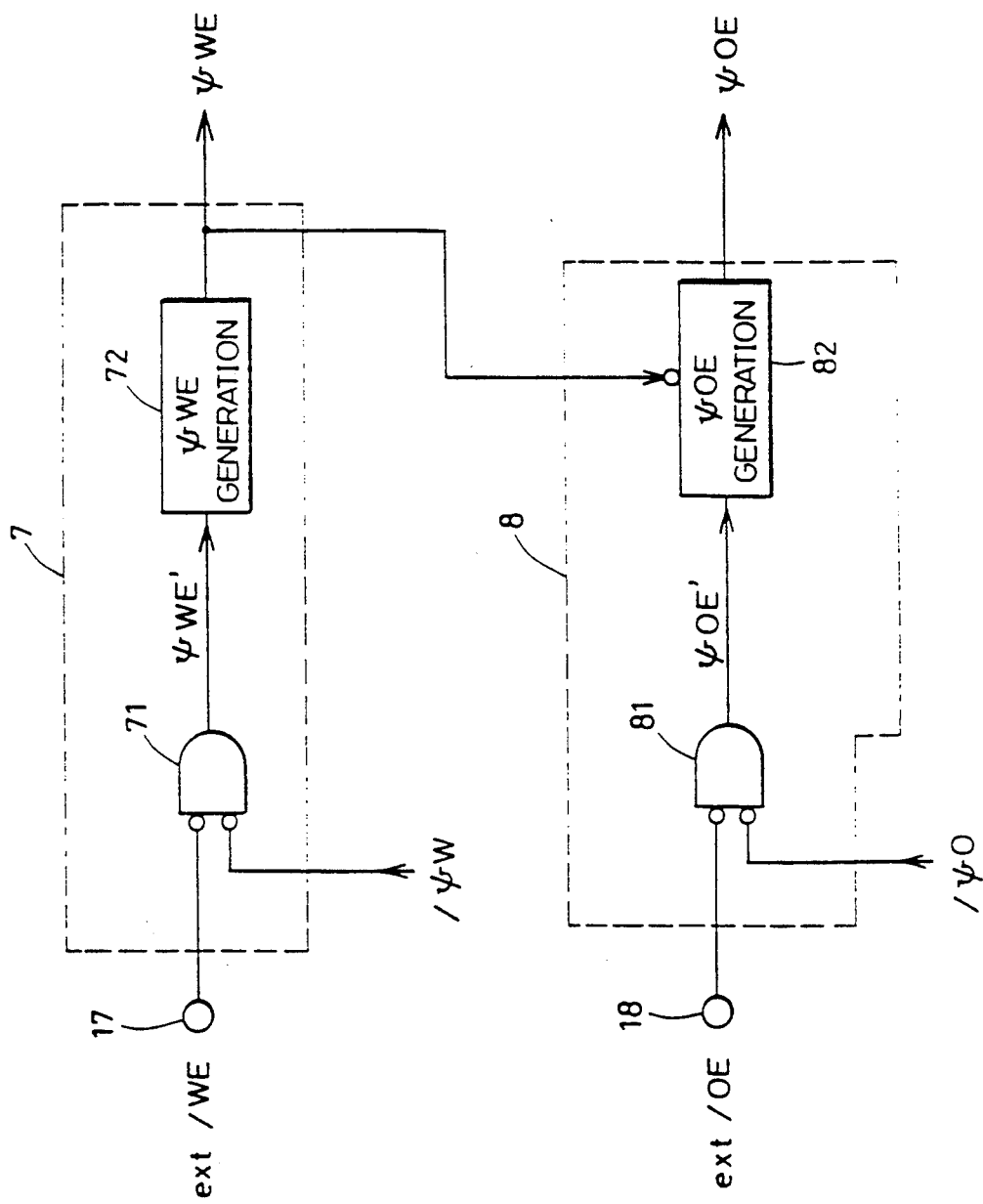
FIG. 2 is a diagram showing construction of a conventional buffer circuit for write enable and a buffer circuit for output enable.
Figure 3:
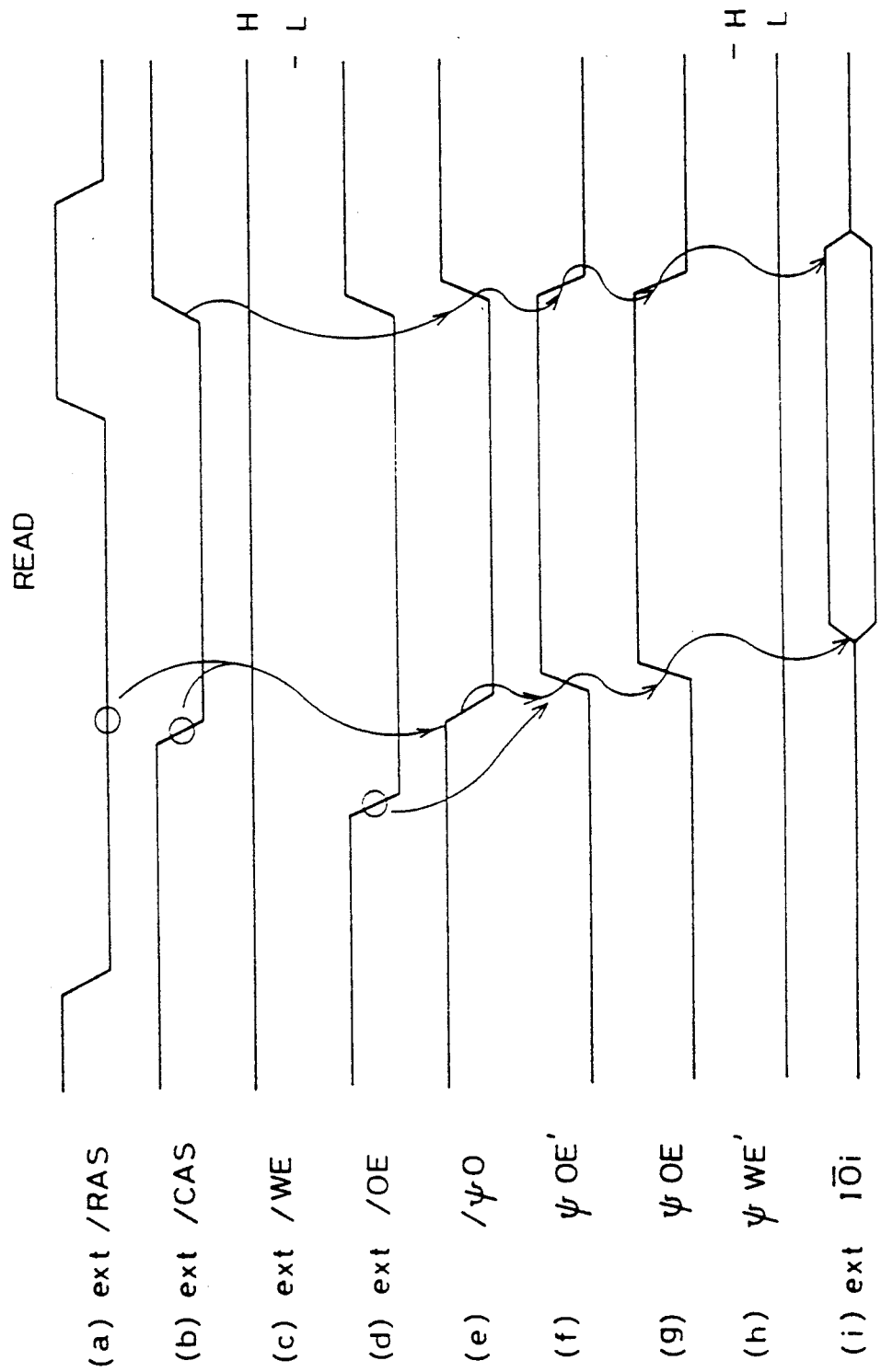
FIG. 3 is a signal waveform diagram for representing operation in data reading of the buffer circuit shown in FIG. 4.
Figure 4:
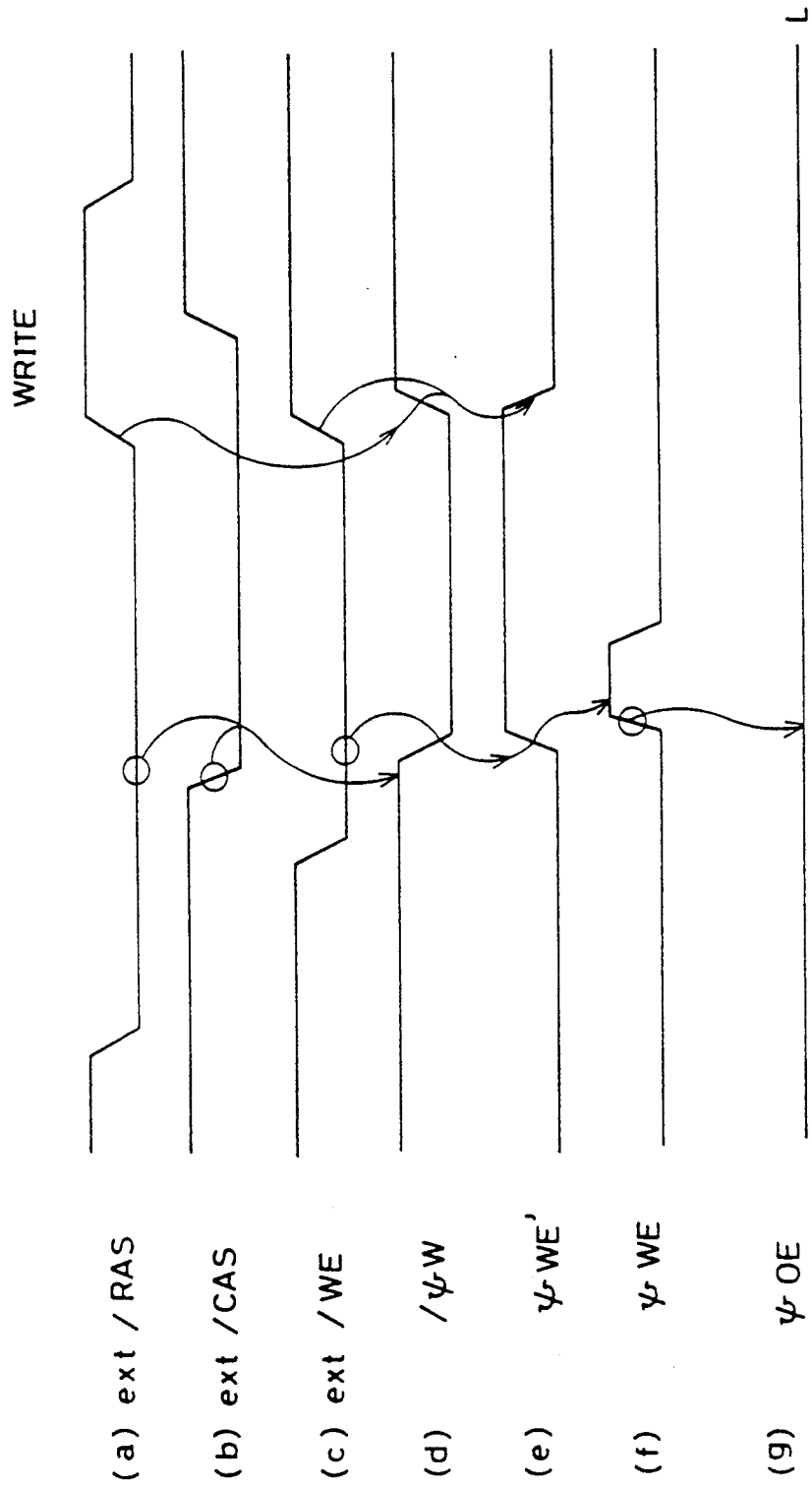
FIG. 4 is a signal waveform diagram representing operation in data writing of the buffer circuit shown in FIG. 2.
Figure 13:
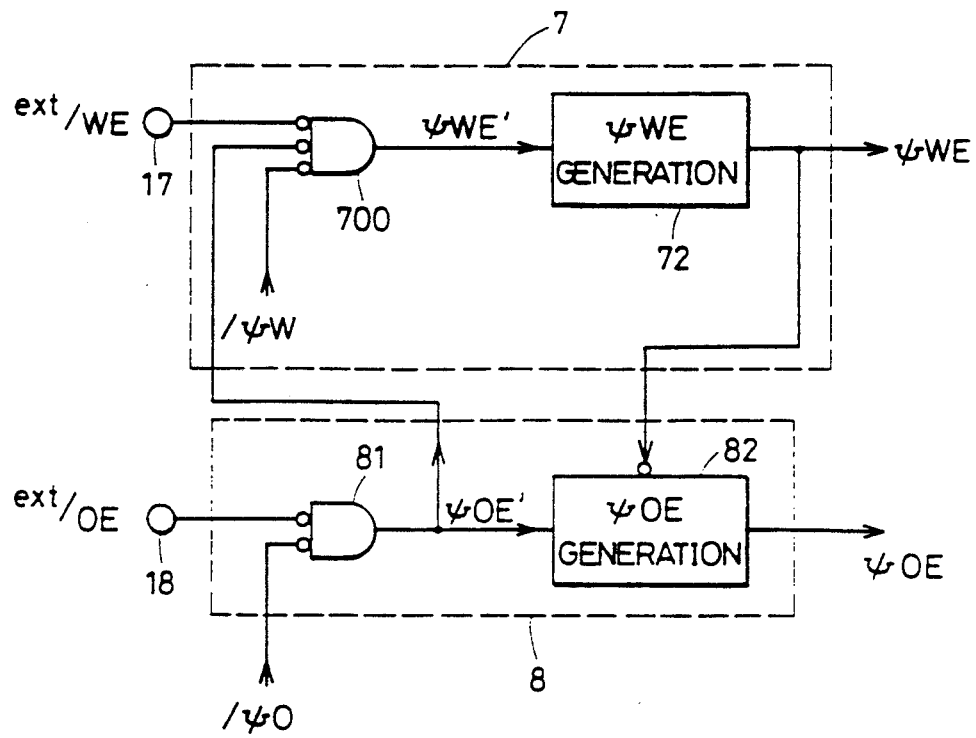
FIG. 13 is a block diagram illustrating construction of a buffer circuit for write enable and a buffer circuit for output enable in a semiconductor memory device which is one embodiment of the present invention.

FIG. 13 is a block diagram illustrating constructions of a buffer circuit 7 for write enable and a buffer circuit 8 for output enable which is one embodiment of the present invention. In FIG. 13, the same reference numerals are assigned to components corresponding to the components in the conventional buffer circuit shown in FIG. 2. In FIG. 13, write enable buffer circuit 7 includes a gate circuit 700 at the first stage receiving an external write designating signal ext/WE applied to an external clock input terminal 17, a first internal output designating signal $\psi OE'$ from output enable buffer circuit 8 and an internal control signal/$\psi W$ from buffer circuit 6 for internal clock generation, and a $\psi WE$ generating circuit 72 for generating a second internal write designating signal $\psi WE$ in a pulse form lasting for a predetermined time in response to the first internal write designating signal $\psi WE$ from the gate circuit 700 at the first stage. Buffer circuit 8 for output enabling has the same construction as that in the conventional buffer circuit 8 for output enabling shown in FIG. 2, which includes a gate circuit 81 and a $\psi OE$ generating circuit 82. The operation of the circuit shown in FIG. 13 is the same as shown in the operation waveform diagram shown in FIGS. 3 and 4, but the operations in data reading and writing will be briefly described below.

First, an operation in data reading will be described. When strobe signals/RAS and /CAS which are operation timing defining signals externally applied attain an active state at "L", an internal control signals $\psi O$ falls to "L". Gate circuit 81 sets a first internal output designating signal $\psi OE$ to an active state at "H" when both of an output designating signal ext/OE applied to clock input terminal 18 and an internal control signal /$\psi O$ attain an active state at "L". $\psi OE$ generating circuit 82 generates a second internal output designating signal $\psi OE$ in response to a first internal output designating signal $\psi OE'$ and applies the second internal output designating signal to an output buffer 9a. Output buffer 9a produces output data from the data applied onto a common data bus 50 in response to the second internal output designating signal $\psi OE$ in the active state and outputs the produced output data outside the device through data input/output terminal 19.

The first internal output designating signal ψOE' is also applied to a gate circuit 700 provided at the first stage of write enable buffer circuit 7. Gate circuit 700 attains an output disable state in response to the first internal output designating signal ψOE'. That is, gate circuit 700 sets the first internal write designating signal ψWE' to "L" level and inhibits generation of the first and second internal write designating signals ψWE' and ψWE. At that time, even if noise (a disadvantageous rise of ground line potential) is caused due to a data output operation of output buffer 9a and an external control signal ext/WE is determined to be at a "L" level due to the noise since the first internal output designating signal ψOE' applied to gate circuit 700 is at sufficient "H" level, glitch is not generated in the first internal glitch is not generated in the first internal write designating signal ψWE'. Therefore, the internal write designating signals ψWE' and ψWE are surely fixed to an inactive state at "L" level.

Also, even if the potential of a ground line rises (refer to 160 in FIG. 4) to raise the "L" level of the first internal write designating signal ψWE', since a "L" determination level of ψWE and ψWE' generating circuit 72 is also raised second internal write designating signal ψWE fixed to "L" is outputted from ψWE generating circuit 72. Thus, even if noise is caused in data reading, the first and second internal write designating signals ψWE and ψWE' can be set at a "L" level which is an inactive state to prevent generation thereof to avoid reset of ψOE generating circuit 82 in data reading operation.

Especially, when the first internal read designating signal ψOE' is applied to gate circuit 700 at the first stage of write enable buffer circuit 7 as an inhibition signal, the gate circuit 700 is brought into an output disable state before noise generation due to the data read operation by output buffer 9a, so that generation of the first and second internal write designating signal and ψWE' is inhibited more certainly.

In data writing operation, an output designating signal ext/OE applied to external clock input terminal 18 is at "H", and a first internal output designating signal ψOE' from gate circuit 81 is in an inactive state "L". Accordingly, gate circuit 700 generates a first internal write designating signal ψWE' in response to a write designating signal ext/WE from the outside and an internal control signal /ψWE. ψWE generating circuit 72 generates a second write designating signal ΦWE in a pulse form lasting for a predetermined time period in response to the first internal write designating signal ψWE' and provides the second write designating signal to input buffer 9b. Input buffer 9b produces internal write data onto common data bus 50 from data applied to data input/output terminal 19 in response to second internal designating signal ψWE.

Figure 10:
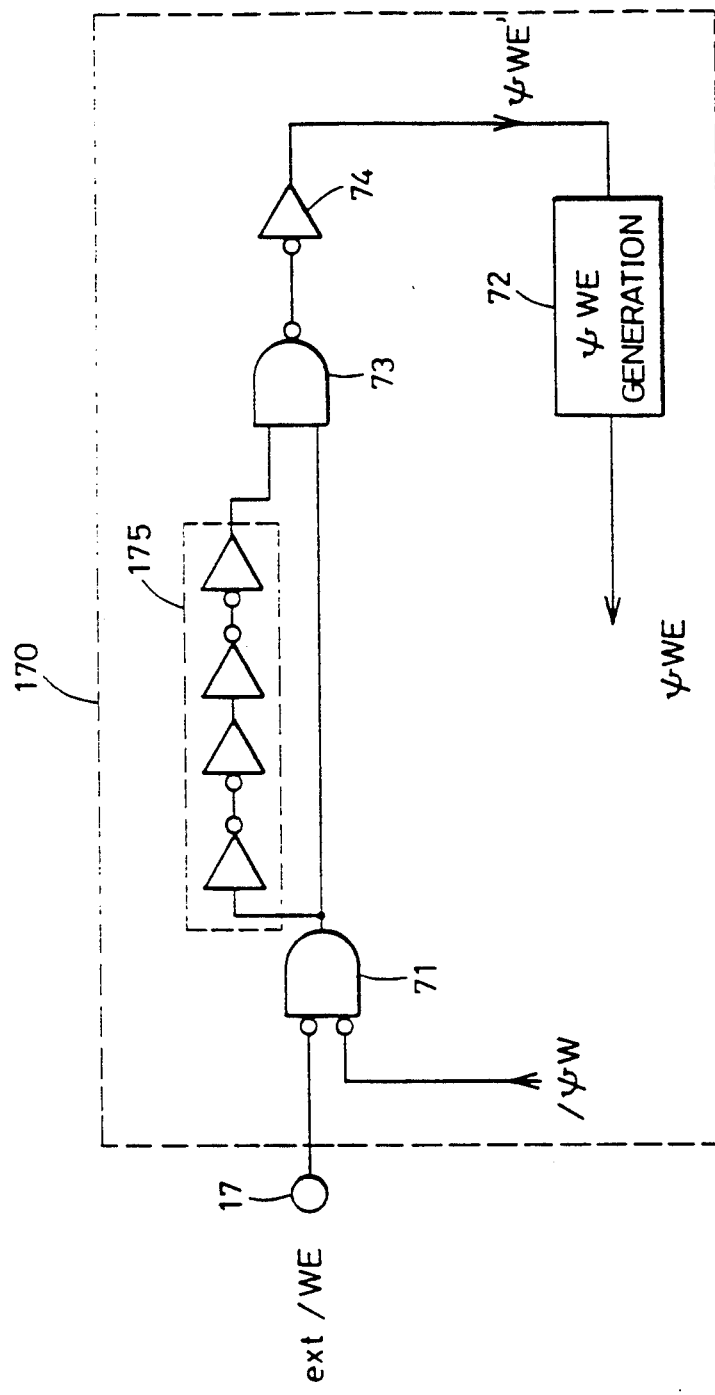
FIG. 10 is a diagram illustrating another example of construction of a buffer circuit for write enable of a conventional semiconductor memory device.
Figure 11:
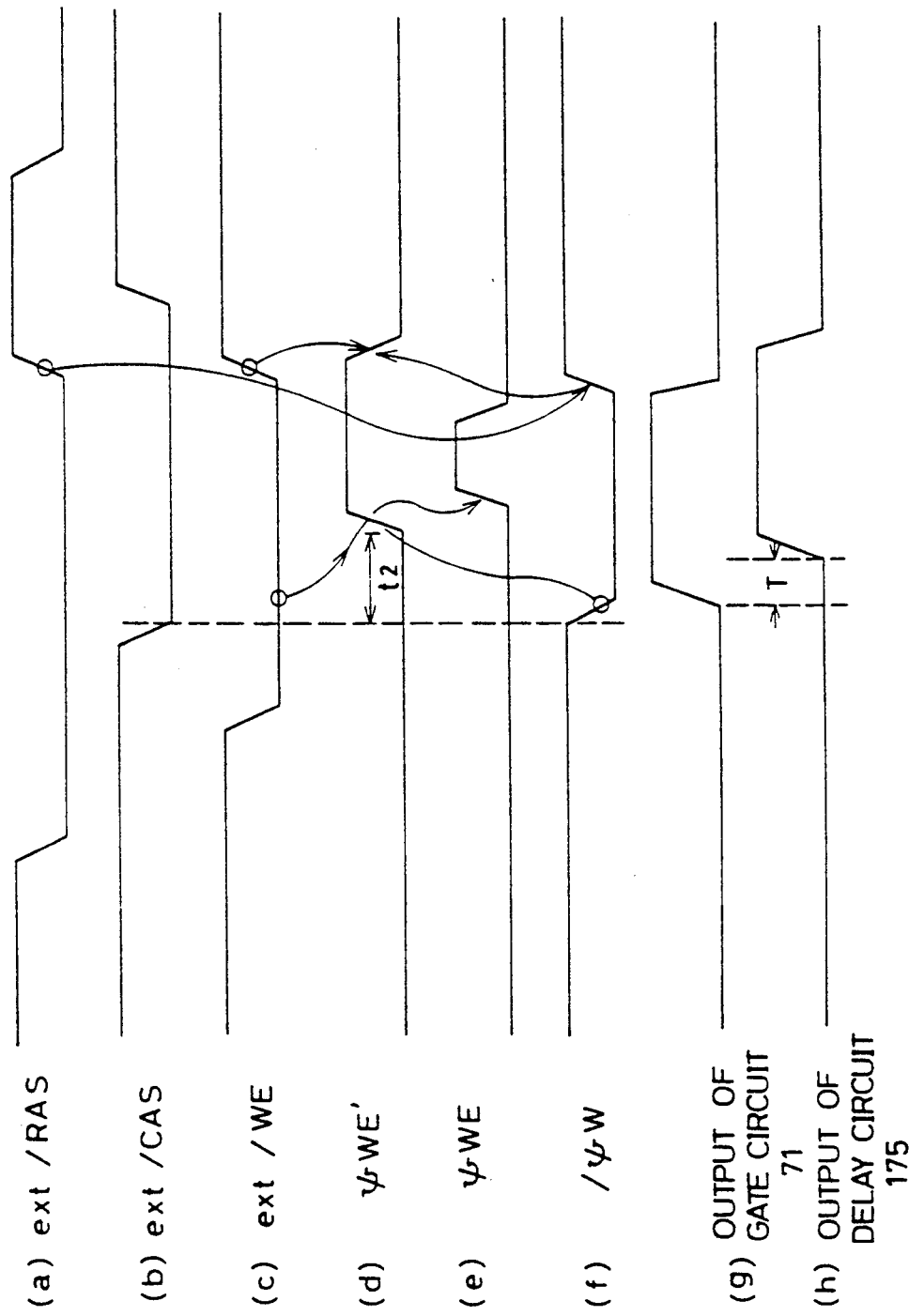
FIG. 11 is a signal waveform diagram representing an operation of the conventional buffer circuit for write enable shown in FIG. 10.
Figure 12:
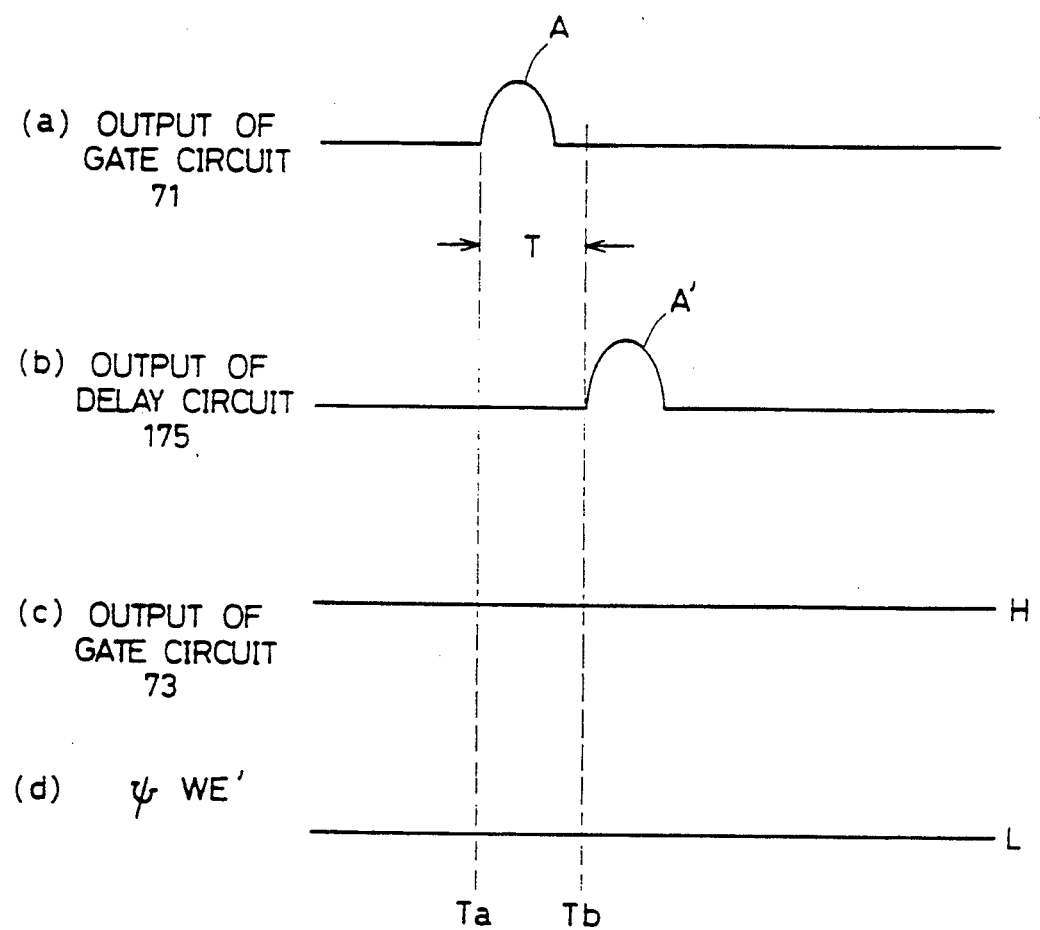
FIG. 12 is a signal waveform diagram showing operation in noise occurrence of the write enable buffer circuit shown in FIG. 10.

With construction as described above, provision of a delay circuit for preventing generation of glitch in a first internal write designating signal as shown in FIG. 10 is not required. A write enable buffer circuit can be obtained which can surely eliminate bad influences of noise caused when data is outputted without adverse effects upon data writing speed.

In the structure shown in FIG. 13, generation of an internal write designating signal ψWE is inhibited using the first internal output designating signal ψOE' which attains a stable state before data output buffer 9a is brought into an active state to perform data output operation. As a signal for forbidding, if it is a signal which attains a stable state generated before data is outputted from data output buffer 9a to data input/output terminal 19, an internal output designating signal generated from another stage may be employed other than an internal output designating signal generated from gate circuit 81 as the first stage. For example, a second internal out designating signal ψOE from ψOE generating circuit 82 which is the last stage of the output enable buffer circuit 8 is a signal which attains a stable state prior to the data output operation by data output buffer 9a, the second internal output designating signal ψOE can be applied to gate circuit 700 at the first stage of write enable buffer circuit 7 as an inhibition signal.

Figure 5:
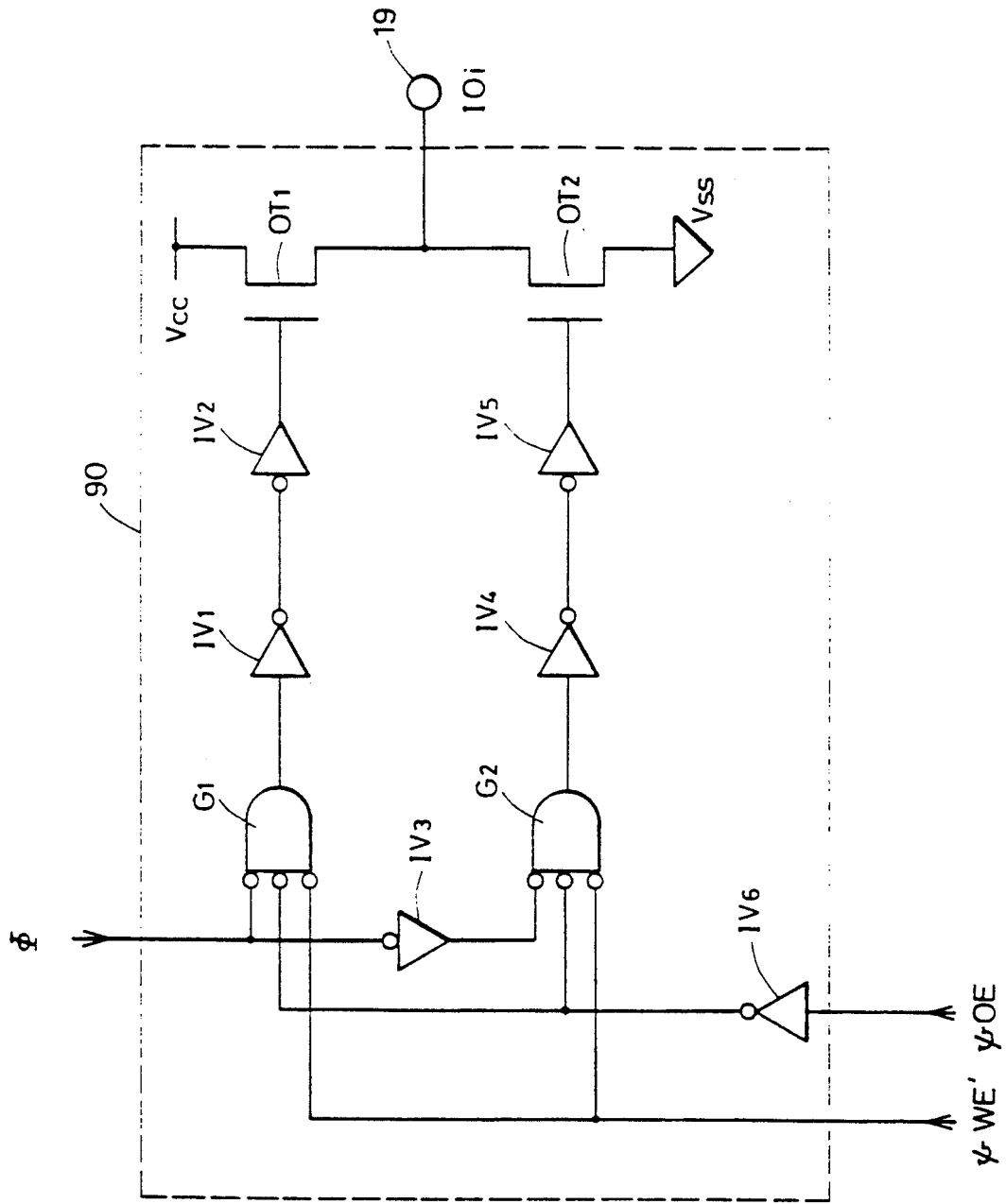
FIG. 5 is a diagram illustrating one example of a construction of a conventional data output buffer.
Figure 6:
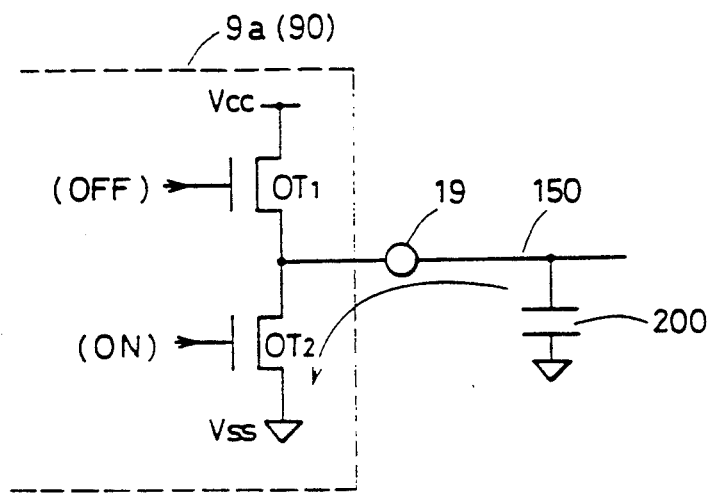
FIG. 6 is a diagram illustrating operation of data output of "L" a conventional data output buffer.
Figure 7:
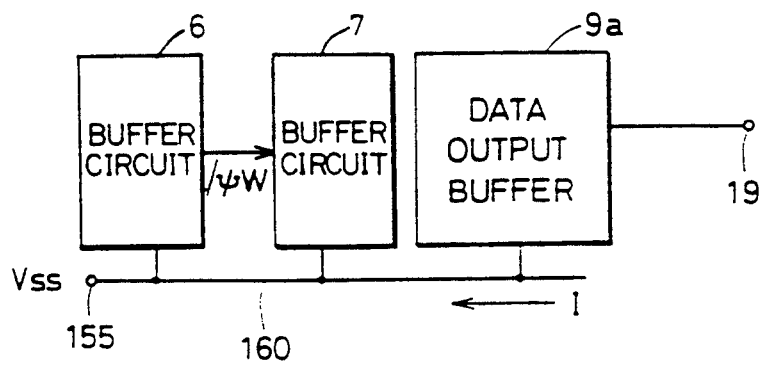
FIG. 7 is a diagram for describing problems in a conventional semiconductor memory device.
Figure 8:
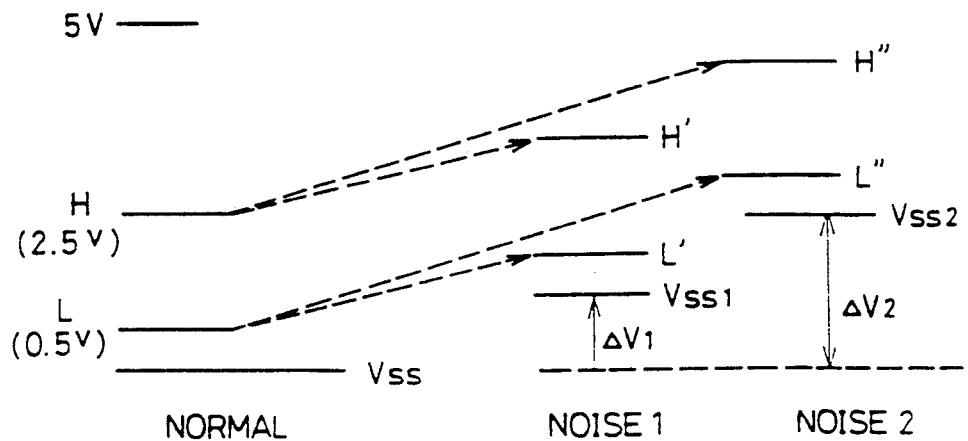
FIG. 8 is a diagram for describing causes of problems in a conventional semiconductor memory device.
Figure 9:
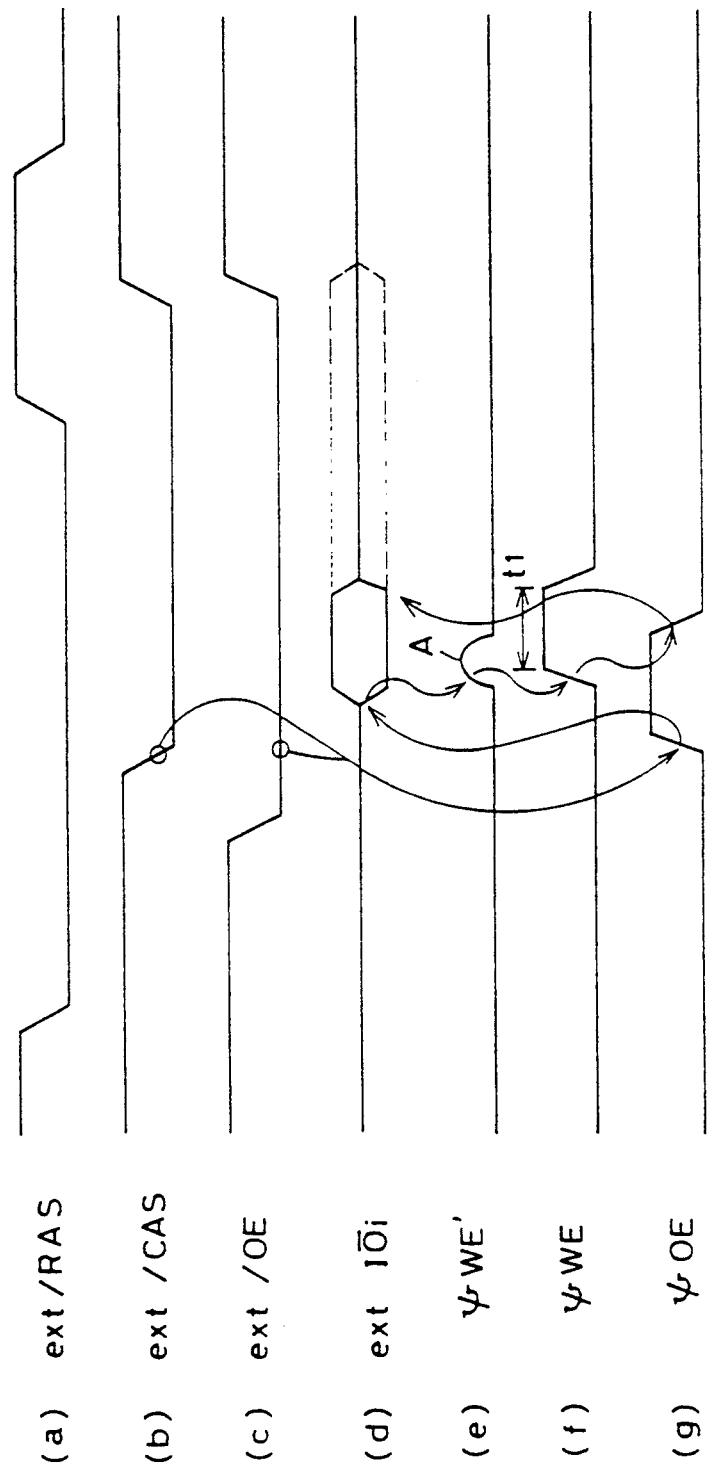
FIG. 9 is a signal waveform diagram illustrating operation in malfunction of a conventional semiconductor memory device.

Also, the output buffer 90 shown in FIG. 5 may be employed as an output buffer.

Figure 14:
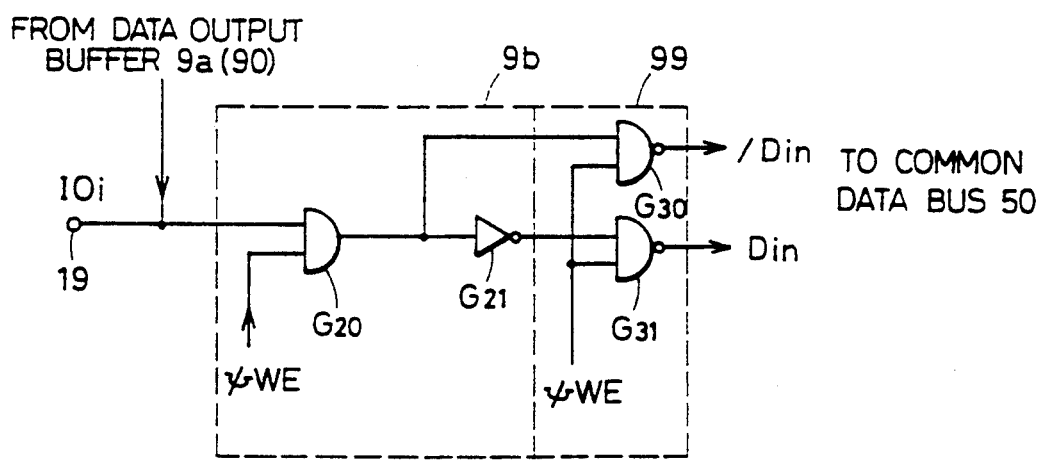
FIG. 14 is a block diagram showing construction of a data input buffer of a semiconductor memory device which is another embodiment of the present invention.

FIG. 14 is a diagram showing construction of a data input buffer of a semiconductor memory device which is another embodiment of the present invention. A conventional data input buffer 9b includes a gate circuit 20 provided at the first stage and an inverter circuit G21 receiving an output of gate circuit 20. Gate circuit G20 receives write data IOi applied to data input/output terminal 19 and a second internal write designating signal ψWE. Internal write data of positive logic is produced from an output of the gate circuit G20 and internal write data of negative logic is produced from inverter circuit G21. In the conventional structure of a data write buffer, an internal write designating signal ψWE is fixed to "L" and an output of gate circuit G20 is at "L" in data output operation. In this case, internal write data of "H" and "L" are produced from the data input buffer 9b. In this case, although not shown, a preamplifier for writing provided in common data bus 50 is brought into an inactive state and an output high impedance state is implemented. In this case, since complementary internal data are produced, there is a possibility that the write data may be transmitted to a selected memory cell due to some cause.

Accordingly, in the construction shown in FIG. 14, a write control circuit 99 is further provided at an output of data input buffer 9b. The write control circuit 99 includes a gate circuit G30 receiving an output of gate circuit G20 and a second internal write designating signal ψWE, and a gate circuit G31 receiving an output of inverter circuit G21 and the second internal write designating signal ψWE. Both of gate circuits G30 and G31 operate as inverter circuits when the second write designating signal ψWE is at "H". Accordingly, in data writing, internal input data/Din having its logic inverted from write data IOi applied to data input/output terminal 19 are outputted from gate circuit G30. Write data Din having its logic the same as that of the write data IOi is produced from gate circuit G31.

In data output, the internal write designating signal ψWE is certainly fixed to "L". Accordingly, an output of gate circuit G20 is fixed to "L". At that time, both of outputs/Din and Din of gate circuits G30 and G31 are fixed to the same "H" level. With the structure, even if data from data output buffer 9a (or 90) is transmitted to data input/output terminal 19 and noise is produced in the data, the unstable data including the noise is not transmitted again into the device through data input buffer 9b, so that a stable semiconductor memory device can be obtained. Especially, the circuit construction shown in FIG. 14 is effective in a device in which the internal write data Din and /Din are transmitted to a data write circuit while data is written into a memory cell by the difference between the write data and a reference potential, such as a bipolar RAM.

In addition, although a NAND type gate circuit is employed as a write control circuit 99 in the circuit shown in FIG. 14, a gate circuit may be employed in which an output is fixed to "L" when a second internal write designating signal ψWE is "L", or a NOR type gate circuit may be employed.

Although a dynamic type random access memory is considered as an example of a semiconductor memory device in the above-described embodiments, the present invention is also applicable to a static type random access memory. Any semiconductor memory device which can be subjected to read an write of data in a random sequence, can be employed.

Even for a semiconductor memory device in which data writing and reading are performed only in the sequential order, if it has construction in which a data input buffer and a data output buffer are activated in response to an internal write designating signal and an internal output designating signal, respectively, the same effects as those in the above-described embodiments can be obtained.

Further, even with a structure in which data input and data output are performed through separated terminals, as far as a data input buffer are activated with an internal output designating signal and an internal write designating signal, respectively, the same effects as those in the above-described embodiments can be obtained. That is, the present invention is applicable to any semiconductor memory devices including a write enable buffer circuit and an output buffer circuit.

As described above, according to the present invention, generation of an internal write designating signal is inhibited with an internal output designating signal. Accordingly, a semiconductor memory device with high speed and high reliability capable of certainly outputting precise data without sacrifice of data writing speed can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a plurality of memory cells, comprising:
   first control signal generating means responsive to a main data read designating signal for generating an internal data read designating signal instructing reading of data of a selected memory cell in said plurality of memory cells;
   output buffer means responsive to said internal data read designating signal for producing read-out data corresponding to the data of the selected memory cells; and
   second control signal generating means responsive to a data write designating signal for generating an internal data write designating signal instructing writing of data into the selected memory cell, said second control signal generating means including inhibition means responsive to said internal data read designating signal for inhibiting generation of said internal data write designating signal at a timing earlier than activation of said output buffer means.

2. A semiconductor memory device according to claim 1, wherein said inhibition means comprises gate means receiving said data write designating signal and said internal data read designating signal for inhibiting generation of said internal data write designating signal in response to said internal data read designating signal.

3. A semiconductor memory device according to claim 1, wherein
   said internal data read designating signal including a first internal data read designating signal,
   said first control signal generating means includes gate means receiving said main data read designating signal for generating said first internal data read designating signal responsive thereto and first signal generating means responsive to said first internal data read designating signal for generating said internal data read designating signal for a predetermined period, said first internal data read designating signal being applied to said inhibition means.

4. A semiconductor memory device according to claim 1, further comprising:
   a data input node for receiving data;
   input buffer means responsive to said internal data write designating signal for generating data complementary to each other corresponding to data received from said data input node, and
   write control means responsive to said internal data write designating signal for transferring said data complementary to each other received from said input buffer means onto a data bus for transferring data to the selected memory cell, said write control means including means for setting said data complementary to each other at an identical logic level when said internal data write designating signal is at an inactivated state.

5. A semiconductor memory device comprising:
   a memory cell array including a plurality of memory cells arranged in a matrix of rows and columns;
   internal clock generating means responsive to external operating timing determining signals, for generating a plurality of internal clock signals;
   selecting means responsive to an external address signal and a first internal clock signal generated from said internal clock generating means for selecting a memory cell corresponding to said external address signal in said memory cell array;
   internal output designating signal generating means responsive to a second internal clock signal from said internal clock generating means and an external output designating signal for generating an internal output designating a signal, said internal output designating signal generating means including gate means responsive to said external output designating signal and said second internal clock signal for generating a first internal output designating signal, and means responsive to said first internal output designating signal for generating a second internal output designating signal;
   output means activated in response to said second internal output designating signal for outputting externally to said memory device data read out from a memory cell selected by said selecting means;
   internal write designating signal generating means responsive to a third clock signal generated from said internal clock generating means and an external write designating signal for generating an internal write designating signal, said internal write designating generating means including inhibition means responsive to said first internal output designating signal for inhibiting activation of said internal write designating signal at a timing earlier than activation of said output means; and input means responsive to said internal write designating signal for generating internal write data corresponding to external write data to be written into the memory cell by said selecting means.

6. A semiconductor memory device according to claim 5, wherein said internal write designating signal generating means includes gate means as said inhibition means responsive to said internal output designating signal for selectively transferring said external write designating signal to generate a first internal write designating signal, and means responsive to said first internal write signal for generating a second internal write designating signal to said input means.

7. A semiconductor memory device according to claim 6, wherein said internal output designating signal generating mans includes gate means responsive to said external output designating signal and said second internal clock signal for generating a first internal output designating signal, and means responsive to said first internal output designating signal for generating said internal output designating signal to said output means, said first internal output designating signal being applied to said inhibition means.

8. A method of operating a semiconductor memory device including an input buffer means for generating internal data to be written into a selected memory cell from an externally supplied data, and an output buffer means for generating an external data for outputting from data read out from a selected memory cell, comprising the steps of;

generating an internal read designating signal to activate said output buffer means, in response to an external read designating signal, generating an internal write designating signal to activate said input buffer means, in response to an externally supplied write designating signal; and, inhibiting said internal write designating signal from being generated prior to the activation of said output buffer means when said internal read designating signal is generated.

9. A method of operating the semiconductor memory device according to claim 8, wherein said step of inhibiting includes the step of setting, in response to said internal read designating signal, gate means receiving said externally supplied write designating signal at an output disable state in which said gate means outputs an inactive state signal regardless of the state of said externally supplied write designating signal.

10. A method of operating a semiconductor memory device according to claim 9, wherein said step of generating an internal read designating signal includes the steps of generating a first internal read designating signal in response to said externally supplied read designating signal, and generating said internal read designating signal to said output buffer means, said first internal read designating signal being applied to said gate means.

11. A method of operating a semiconductor memory device according to claim 8, further comprising the step of receiving data from said input buffer means and generating internal signals of an identical logic level onto a data bus provided for transferring data to the selected memory cell when said internal write designating signal is at an inactive state.

* * * * *